US 11,466,209 B2

(12) United States Patent
Sugimura et al.

(10) Patent No.: US 11,466,209 B2
(45) Date of Patent: Oct. 11, 2022

(54) CHEMICAL SOLUTION AND METHOD FOR TREATING SUBSTRATE

(71) Applicant: FUJIFILM Corporation, Tokyo (JP)

(72) Inventors: Nobuaki Sugimura, Haibara-gun (JP); Tomonori Takahashi, Haibara-gun (JP); Hiroyuki Seki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/192,391

(22) Filed: Mar. 4, 2021

(65) Prior Publication Data
US 2021/0189235 A1 Jun. 24, 2021

Related U.S. Application Data

(63) Continuation of application No. PCT/JP2019/031627, filed on Aug. 9, 2019.

(30) Foreign Application Priority Data

Sep. 6, 2018 (JP) .............................. JP2018-166714
Jul. 24, 2019 (JP) .............................. JP2019-136308

(51) Int. Cl.
C09K 13/06 (2006.01)
H01L 21/3213 (2006.01)

(52) U.S. Cl.
CPC ........ C09K 13/06 (2013.01); H01L 21/32134 (2013.01)

(58) Field of Classification Search
None
See application file for complete search history.

(56) References Cited

U.S. PATENT DOCUMENTS 5,486,627 A * 1/1996 Quarderer, Jr. ...... C07D 301/26
568/850
5,532,389 A * 7/1996 Trent ...................... C07C 29/66
423/474

(Continued)

FOREIGN PATENT DOCUMENTS

CN 102634801 A 8/2012
JP 2-046729 A 2/1990

(Continued)

OTHER PUBLICATIONS

International Search Report dated Nov. 12, 2019, issued by the International Searching Authority in application No. PCT/JP2019/031627.

(Continued)

Primary Examiner — Allan W. Olsen
(74) Attorney, Agent, or Firm — Sughrue Mion, PLLC

(57) ABSTRACT

The present invention provides a chemical solution which has an excellent dissolving ability for a transition metal-containing substance and can realize excellent smoothness of a portion to be treated. Furthermore, the present invention provides a method of treating a substrate.
The chemical solution according to an embodiment of the present invention is used for removing a transition metal-containing substance on a substrate. The chemical solution contains one or more kinds of specific hypochlorous acids selected from the group consisting of hypochlorous acid and a salt thereof and contains one or more kinds of specific anions selected from the group consisting of $ClO_3^-$ and $Cl^-$. In a case where the chemical solution contains one kind of the specific anion, the content of one kind of the specific anion is 5 ppb by mass to 1% by mass with respect to a total mass of the chemical solution. In a case where the chemical solution contains two kinds of the specific anions, a content of each of two kinds of the specific anions is equal to or (Continued)

lower than 1% by mass with respect to the total mass of the chemical solution, and a content of at least one of two kinds of the specific anions is equal to or higher than 5 ppb by mass with respect to the total mass of the chemical solution.

21 Claims, 2 Drawing Sheets

(56) References Cited

U.S. PATENT DOCUMENTS

| | | | |
|---|---|---|---|
| 6,116,254 A | | 9/2000 | Shiramizu |
| 10,881,111 B1* | | 1/2021 | Kim .................. A01N 59/00 |
| 2003/0139045 A1 | | 7/2003 | Aoki et al. |
| 2004/0023496 A1* | | 2/2004 | Jung ................ H01L 21/7684 |
| | | | 438/692 |
| 2004/0232381 A1* | | 11/2004 | Pinza ................ A01N 59/00 |
| | | | 252/187.26 |
| 2005/0142157 A1* | | 6/2005 | Alimi ................ A61L 2/0088 |
| | | | 424/405 |
| 2005/0176603 A1* | | 8/2005 | Hsu .................... G03F 7/423 |
| | | | 510/175 |
| 2009/0212021 A1 | | 8/2009 | Bernhard et al. |
| 2010/0272830 A1* | | 10/2010 | Faita ................ A01N 59/00 |
| | | | 424/665 |
| 2010/0330204 A1* | | 12/2010 | Chen .................. A61P 27/12 |
| | | | 424/665 |
| 2014/0134224 A1* | | 5/2014 | Mallet ................ A61L 2/0088 |
| | | | 424/408 |
| 2017/0222138 A1 | | 8/2017 | Park et al. |
| 2021/0206636 A1* | | 7/2021 | Goda .................... C01B 11/06 |

FOREIGN PATENT DOCUMENTS

| | | | |
|---|---|---|---|
| JP | 8-274057 A | | 10/1996 |
| JP | 2621398 B2 * | | 6/1997 |
| JP | 2003-218084 A | | 7/2003 |
| JP | 2008-547202 A | | 12/2008 |
| JP | 2009-004807 A | | 1/2009 |
| JP | 2013-239661 A | | 11/2013 |
| KR | 10-2018-0088441 A | | 8/2018 |
| WO | 2016/068183 A1 | | 5/2016 |

OTHER PUBLICATIONS

Written Opinion dated Nov. 12, 2019, issued by the International Searching Authority in application No. PCT/JP2019/031627.
International Preliminary Report on Patentability dated Mar. 9, 2021, issued by the International Bureau in application No. PCT/JP2019/031627.
Office Action dated May 24, 2022 from the Japanese Patent Office in JP Application No. 2020-541089.
Office Action dated Aug. 11, 2022 in Korean Application No. 10-2021-7006600.

* cited by examiner

CHEMICAL SOLUTION AND METHOD FOR TREATING SUBSTRATE

CROSS-REFERENCE TO RELATED APPLICATIONS

This application is a Continuation of PCT International Application No. PCT/JP2019/031627 filed on Aug. 9, 2019, which claims priority under 35 U.S.C. § 119(a) to Japanese Patent Application No. 2018-166714 filed on Sep. 6, 2018 and Japanese Patent Application No. 2019-136308 filed on Jul. 24, 2019. Each of the above applications is hereby expressly incorporated by reference, in its entirety, into the present application.

BACKGROUND OF THE INVENTION

1. Field of the Invention

The present invention relates to a chemical solution and a method for treating a substrate.

2. Description of the Related Art

As the miniaturization of semiconductor products progresses, there is an increasing demand for performing a step of removing unnecessary transition metal-containing substances on a substrate in a semiconductor product manufacturing process with high efficiency and high accuracy.

Generally, regarding the semiconductor product manufacturing process, a method is widely known in which a treatment liquid that dissolves a metal-containing object is used to perform etching or to remove foreign substances adhering to a solid surface. JP2013-239661A describes an alkaline etching solution used for wet etching, which is obtained by dissolving sodium hypochlorite having a specific concentration in an aqueous sodium hydroxide solution.

SUMMARY OF THE INVENTION

In recent years, it has been also required to reduce the roughness (surface roughness) of a portion to be treated at the time of removing unnecessary transition metal-containing substances on a substrate, so that the smoothness of the portion to be treated is improved. In a case where the roughness of the portion to be treated is high, sometimes the lamination properties of substances to be laminated on the portion to be treated deteriorate, which leads to the deterioration of the performance of semiconductor products.

The inventors of the present invention examined the removability of transition metal-containing substances by using the method disclosed in JP2013-239661A. As a result, the inventors have found that the dissolving ability for the transition metal-containing substances and the smoothness of the portion to be treated are not necessarily simultaneously achieved to a sufficient degree and need to be further improved.

Therefore, an object of the present invention is to provide a chemical solution, which has an excellent dissolving ability for a transition metal-containing substance and can realize excellent smoothness of a portion to be treated, and a method for treating a substrate by using the chemical solution.

In order to achieve the above object, the inventors of the present invention conducted intensive examinations. As a result, the inventors have found that by a chemical solution containing hypochlorous acids and a predetermined amount of anions, the above object can be achieved, and have accomplished the present invention.

That is, the inventors have found that the above object can be achieved by the following constitution.

[1] A chemical solution used for removing a transition metal-containing substance on a substrate, containing:
one or more kinds of hypochlorous acids selected from the group consisting of hypochlorous acid and a salt thereof, and one or more kinds of specific anions selected from the group consisting of $ClO_3^-$ and $Cl^-$,
in which in a case where the chemical solution contains one kind of the specific anion, a content of one kind of the specific anion is 5 ppb by mass to 1% by mass with respect to a total mass of the chemical solution, and
in a case where the chemical solution contains two kinds of the specific anions, a content of each of two kinds of the specific anions is equal to or lower than 1% by mass with respect to the total mass of the chemical solution, and a content of at least one of two kinds of the specific anions is equal to or higher than 5 ppb by mass with respect to the total mass of the chemical solution.

[2] The chemical described in [1] containing both of $ClO_3^-$ and $Cl^-$,
in which each of a content of $ClO_3^-$ and a content of $Cl^-$ is 5 ppb by mass to 1% by mass with respect to the total mass of the chemical solution.

[3] The chemical solution described in [1] or [2], in which a content of the hypochlorous acids is equal to or lower than 30% by mass with respect to the total mass of the chemical solution.

[4] The chemical solution described in any one of [1] to [3], in which a content of the hypochlorous acids is 0.5% to 20.0% by mass with respect to the total mass of the chemical solution.

[5] The chemical solution described in any one of [1] to [4], in which a ratio of a content of the hypochlorous acids to a content of the specific anion is $5 \times 10^{-1}$ to $1 \times 10^7$.

[6] The chemical solution described in any one of [1] and [3] to [5], in which in a case where the chemical solution contains one kind of the specific anion, the content of one kind of the specific anion is 1 ppm by mass to 0.1% by mass with respect to the total mass of the chemical solution, and in a case where the chemical solution contains two kinds of the specific anions, the content of each of two kinds of the specific anions is 1 ppm by mass to 0.1% by mass with respect to the total mass of the chemical solution.

[7] The chemical solution described in any one of [1] to [6], in which the hypochlorous acids contain sodium hypochlorite.

[8] The chemical solution described in any one of [1] to [7], further containing one or more kinds of specific cations selected from the group consisting of a quaternary ammonium cation and a quaternary phosphonium cation.

[9] The chemical solution described in any one of [1] to [8], in which the transition metal-containing substance contains at least one kind of metal selected from the group consisting of Ru, Rh, Ti, Ta, Co, Cr, Hf, Os, Pt, Ni, Mn, Cu, Zr, Mo, La, W, and Ir.

[10] The chemical solution described in any one of [1] to [9], in which the transition metal-containing substance contains a Ru-containing substance.

[11] The chemical solution described in any one of [1] to [10] that has a pH equal to or lower than 10.0.

[12] The chemical solution described in any one of [1] to [11] that has a pH higher than 7.0 and lower than 9.0.

[13] A method for treating a substrate, including a step A of removing a transition metal-containing substance on a substrate by using the chemical solution described in any one of [1] to [12].

[14] The method for treating a substrate described in [13], in which the transition metal-containing substance contains a Ru-containing substance.

[15] The method for treating a substrate described in [13] or [14], in which the step A is a step A1, a step A2, a step A3, a step A4, or a step A5 which will be described later.

[16] The method for treating a substrate described in [15], further including a step B which will be described later, in which the step A is the step A1, and the step B is performed before or after the step A1.

[17] The method for treating a substrate described in [16], in which the step A1 and the step B are alternately repeated.

[18] The method for treating a substrate described in any one of [13] to [17], further including a step C which will be described later, in which the step C is performed after the step A.

[19] The method for treating a substrate described in [18], in which the rinsing solution is a solution selected from the group consisting of hydrofluoric acid, hydrochloric acid, aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, and an aqueous orthoperiodic acid solution.

[20] The method for treating a substrate described in any one of [13] to [19], in which a temperature of the chemical solution is 20° C. to 75° C.

According to an aspect of the present invention, it is possible to provide a chemical solution, which has an excellent dissolving ability for a transition metal-containing substance and can realize excellent smoothness of a portion to be treated, and a treatment method using the chemical solution.

DESCRIPTION OF THE PREFERRED EMBODIMENTS

Figure 1:
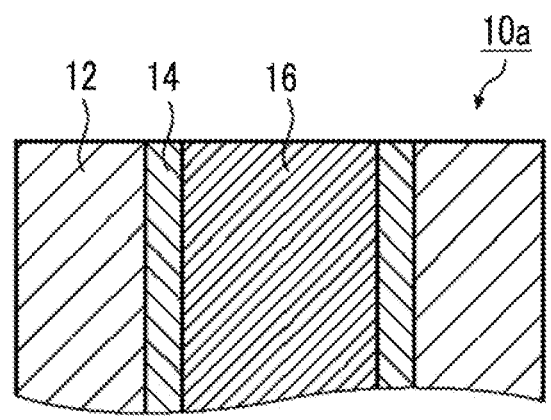
FIG. 1 is a schematic cross-sectional top view showing an example of an object to be treated used in a step A1.

Hereinafter, the present invention will be specifically described.

The following constituents will be described based on typical embodiments of the present invention in some cases, but the present invention is not limited to the embodiments.

In the present specification, in a case where there is no description regarding whether a group (atomic group) is substituted or unsubstituted, as long as the effects of the present invention are not reduced, the group includes both the group having no substituent and the group having a substituent. For example, "alkyl group" includes not only an alkyl group having no substituent (unsubstituted alkyl group) but also an alkyl group having a substituent (substituted alkyl group). The same is true of each compound.

In the present specification, unless otherwise specified, "exposure" includes not only the exposure using a mercury lamp, far ultraviolet rays represented by an excimer laser, X-rays, and Extreme Ultraviolet (EUV) light, but also lithography by particle beams such as electron beams and ion beams.

In the present specification, a range of numerical values described using "to" means a range including numerical values described before and after "to" as a lower limit and an upper limit.

In the present specification, a dry etching residue is a by-product generated as a result of performing dry etching (for example, plasma etching). For example, the dry etching residue contains an organic residue derived from a photoresist, a Si-containing residue, a metal-containing residue (for example, a transition metal-containing residue), and the like.

[Chemical Solution]

The chemical solution is used for removing a transition metal-containing substance on a substrate.

The chemical solution contains hypochlorous acids and specific anions.

The hypochlorous acids are one or more kinds of hypochlorous acids selected from the group consisting of hypochlorous acid and a salt thereof.

The specific anions are one or more kinds of anions selected from the group consisting of $ClO_3^-$ and $Cl^-$.

In a case where the chemical solution contains one kind of the specific anion, a content of one kind of the specific anion is 5 ppb by mass to 1% by mass with respect to a total mass of the chemical solution.

In a case where the chemical solution contains two kinds of the specific anions, a content of each of two kinds of the specific anions is equal to or lower than 1% by mass with respect to the total mass of the chemical solution, and a content of at least one of two kinds of the specific anions is equal to or higher than 5 ppb by mass with respect to the total mass of the chemical solution.

It is unclear through what mechanism the object of the present invention is achieved by the chemical solution described above. According to the inventors of the present invention, the mechanism is assumed to be as below.

First, because the chemical solution contains hypochlorous acids, transition metals excellently dissolve in the chemical solution. Furthermore, because the amount of the specific anion contained in the chemical solution is equal to or higher than a predetermined amount, metallic components (such as metal ions) and the like generated in a case where a transition metal-containing substance on a substrate is removed using the chemical solution interact with the specific anion and hardly remain on the substrate, and the smoothness of a portion to be treated is improved.

<Hypochlorous Acids>

The chemical solution contains hypochlorous acids.

In the present specification, "hypochlorous acids" is a generic term for compounds selected from the group consisting of hypochlorous acid and a salt thereof.

The salt of hypochlorous acid is not particularly limited, and examples thereof include a salt of hypochlorous acid and an alkali metal element (such as sodium and potassium), a salt of hypochlorous acid and an alkali earth metal element (such as magnesium and calcium), and a salt of hypochlorous acid and other metal elements.

As the hypochlorous acids, hypochlorous acid (HClO), sodium hypochlorite (NaClO), potassium hypochlorite (KClO), or calcium hypochlorite (Ca(ClO)$_2$) is preferable. In view of excellent dissolving ability of the chemical solution, sodium hypochlorite is more preferable.

In view of further improving the dissolving ability of the chemical solution, the content of the hypochlorous acids (total content in a case where the chemical solution contains a plurality of hypochlorous acids) with respect to the total mass of the chemical solution is preferably equal to or higher than 0.1% by mass, more preferably equal to or higher than 0.5% by mass, even more preferably equal to or higher than 1.0% by mass, particularly preferably equal to or higher than 5.0% by mass, and most preferably equal to or higher than 15.0% by mass.

In view of further improving the smoothness of the portion to be treated, the content of the hypochlorous acids with respect to the total mass of the chemical solution is preferably equal to or lower than 40.0% by mass, more preferably equal to or lower than 30.0% by mass, and even more preferably equal to or lower than 15.0% by mass.

In view of further improving the balance between the dissolving ability of the chemical solution and the smoothness of the portion to be treated, the content of the hypochlorous acids with respect to the total mass of the chemical solution is preferably 0.1% to 15.0% by mass, and more preferably 0.5% to 5.0% by mass.

The content of the hypochlorous acids in the chemical solution can be determined by ion chromatography. Specifically, examples of the device include Dionex ICS-2100 manufactured by Thermo Fisher Scientific. In a case where the composition of raw materials is known, the content of the hypochlorous acids may be determined by calculation. In a case where the content of the hypochlorous acids in the chemical solution is equal to or lower than the measurement limit, a concentrated solution obtained by concentrating the chemical solution may be used for analysis.

<Specific Anion>

The chemical solution contains a specific anion.

The specific anion is one kind of anion selected from the group consisting of $ClO_3^-$ (chlorate ion) and $Cl^-$ (chloride ion).

The chemical solution may contain one kind of specific anion or two kinds of specific anions. In other words, the chemical solution may contain only one kind of specific anion selected from $ClO_3^-$ and $Cl^-$ or may contain both of $ClO_3^-$ and $Cl^-$.

In a case where the chemical solution contains one kind of the specific anion, the content of one kind of the specific anion is 5 ppb by mass to 1% by mass with respect to a total mass of the chemical solution.

Hereinafter, the content of 5 ppb by mass to 1% by mass with respect to the total mass of the chemical solution will be also called "predetermined content", and the specific anion present in the chemical solution at the predetermined content will be also called "anion at a predetermined content".

In view of further improving the dissolving ability of the chemical solution, the content of the anion at a predetermined content (that is, the predetermined content) with respect to the total mass of the chemical solution is preferably equal to or lower than 0.1% by mass, and more preferably equal to or lower than 0.01% by mass.

In view of further improving the smoothness of the portion to be treated, the content of the anion at a predetermined content (that is, the predetermined content) with respect to the total mass of the chemical solution is preferably equal to or higher than 1 ppm by mass, more preferably equal to or higher than 0.001% by mass, and even more preferably higher than 0.1% by mass.

In view of further improving the balance between the dissolving ability of the chemical solution and the smoothness of the portion to be treated, the content of the anion at a predetermined content (that is, the predetermined content) with respect to the total mass of the chemical solution is preferably 1 ppm by mass to 0.1% by mass, and more preferably 0.001% by mass to 0.01% by mass.

In a case where the chemical solution contains two kinds of the specific anions, the content of each of two kinds of the specific anions ($ClO_3^-$ and $Cl^-$) with respect to the total mass of the chemical solution is preferably equal to or lower than 1% by mass (in view of further improving the dissolving ability of the chemical solution, the content is preferably equal to or lower than 0.1% by mass, and more preferably equal to or lower than 0.01% by mass).

Furthermore, the content of at least one of two kinds of the specific anions is equal to or higher than 5 ppb by mass with respect to the total mass of the chemical solution (in view of further improving the smoothness of the portion to be treated, the content is preferably equal to or higher than 1 ppm by mass, more preferably equal to or higher than 0.001% by mass, and even more preferably higher than 0.1% by mass).

In other words, the chemical solution contains at least one kind of the anion at a predetermined content, and the content of any of the specific anions does not exceed 1% by mass with respect to the total mass of the chemical solution.

In view of further improving the smoothness of the portion to be treated, an embodiment is preferable in which the chemical solution contains two kinds of the specific anions ($ClO_3^-$ and $Cl^-$), and the content of each of $ClO_3^-$ and $Cl^-$ is 5 ppb by mass to 1% by mass with respect to the total mass of the chemical solution.

In a case where the chemical solution contains two kinds of the anions at a predetermined content, the content of at least one of two kinds of the anions at a predetermined content is preferably 1 ppm by mass to 0.1% by mass, and more preferably 0.001% to 0.01% by mass. The content of each of two kinds of the anions at a predetermined content may be in the above range.

In a case where the chemical solution contains two kinds of the specific anions, the total content of the specific anions in the chemical solution is higher than 5 ppb by mass and equal to or lower than 2% by mass with respect to the total mass of the chemical solution. The total content of the specific anions is preferably 2 ppm by mass to 0.2% by mass, and more preferably 0.002% to 0.02% by mass.

In view of further improving the dissolving ability of the chemical solution, the ratio (mass ratio) of the content of the hypochlorous acids to the total content of the specific anions in the chemical solution is preferably equal to or higher than $5 \times 10^{-1}$, more preferably equal to or higher than $5 \times 10^0$, and even more preferably equal to or higher than $5 \times 10^1$. In view of further improving the smoothness of the portion to be treated, the ratio is preferably equal to or lower than $1 \times 10^7$, more preferably lower than $2 \times 10^6$, and even more preferably equal to or lower than $1 \times 10^4$.

In view of further improving the balance between the dissolving ability of the chemical solution and the smoothness of the portion to be treated, the ratio is preferably $5 \times 10^0$ to $1 \times 10^7$, and more preferably $5 \times 10^1$ to $1 \times 10^4$.

The method of incorporating the specific anion into the chemical solution is not limited. For example, a raw material that contains a compound containing the specific anion as a main component may be added to a solution of hypochlorous acids during the preparation of the chemical solution, immediately before the treatment of a substrate, and the like, so that a predetermined amount of the specific anion is incorporated into the chemical solution. Alternatively, a raw material that contains a trace of the specific anion as an impurity and the like may be used for preparing the chemical solution, so that a predetermined amount of the specific anion may be incorporated into the chemical solution.

The compound containing the specific anion is not particularly limited, and examples thereof include a compound that generates the specific anion and a cation by being dissociated in a solution (preferably an aqueous solution) of the hypochlorous acids.

More specifically, examples of the compound include chloric acid ($HClO_3$), hydrochloric acid (HCl), and salts of these (for example, a salt with an alkali metal and a salt with an alkali earth metal). Among these, chloric acid, sodium chlorate ($NaClO_3$), potassium chlorate ($KClO_3$), hydrochloric acid, sodium chloride (NaCl), or potassium chloride (KCl) is preferable, and chloric acid or hydrochloric acid is more preferable.

There is no particular limitation on the combination of a compound containing $ClO_3^-$ and a compound containing $Cl^-$ that are used for preparing the chemical solution containing both of $ClO_3^-$ and $Cl^-$. For example, one or more kinds of compounds selected from chloric acid and a salt thereof and one or more kinds of compounds selected from hydrochloric acid and a salt thereof may be combined. It is preferable to combine chloric acid, sodium chlorate, or potassium chlorate with hydrochloric acid, sodium chloride, or potassium chloride, and more preferable to combine chloric acid with hydrochloric acid.

The content of the specific anion and a specific cation, which will be described later, in the chemical solution is determined by ion chromatography. Specifically, examples of the device include Dionex ICS-2100 manufactured by Thermo Fisher Scientific. Furthermore, in a case where the composition of raw materials is known, the content of the specific anion may be determined by calculation.

<Optional Components>

The chemical solution may contain other optional components in addition to the components described above. Hereinafter, the optional components will be described.

(Specific Cation)

The chemical solution may contain one or more kinds of specific cations selected from the group consisting of a quaternary ammonium cation and a quaternary phosphonium cation. In view of further improving the smoothness of the portion to be treated, it is preferable that the chemical solution the specific cation.

The chemical solution may contain one kind of specific cation or two or more kinds of specific cations. In other words, the chemical solution may contain only one kind of specific cation selected from a quaternary ammonium cation and a quaternary phosphonium cation, or may contain both the quaternary ammonium cation and quaternary phosphonium cation. In addition, the chemical solution may contain two or more kinds of quaternary ammonium cations, or may contain two or more kinds of quaternary phosphonium cations.

The method of incorporating the specific cation into the chemical solution is not limited. For example, a compound selected from a quaternary ammonium compound and a quaternary phosphonium compound which will be described later may be added to the chemical solution during the preparation of the chemical solution or immediately before the treatment of a substrate. —Quaternary Ammonium Cation—

The quaternary ammonium cation is not particularly limited as long as it is a cation formed by the substitution of a nitrogen atom with 4 hydrocarbon groups. As the quaternary ammonium cation, the following cation represented by Formula (1) is preferable.

Formula (1)

In Formula (1), $R^{4A}$ to $R^{4D}$ each independently represent an alkyl group, a hydroxyalkyl group, a benzyl group, or an aryl group.

As the alkyl group, an alkyl group having 1 to 6 carbon atoms is preferable, and a methyl group, an ethyl group, a propyl group, or a butyl group is more preferable.

As the hydroxyalkyl group, a hydroxyalkyl group having 1 to 6 carbon atoms is preferable, and a hydroxymethyl group, a hydroxyethyl group, a hydroxypropyl group, or a hydroxybutyl group is more preferable.

The aryl group is preferably a phenyl group or a naphthyl group, and more preferably a phenyl group.

As $R^{4A}$ to $R^{4D}$ in Formula (1), an alkyl group having 1 to 6 carbon atoms, a hydroxyalkyl group having 1 to 6 carbon atoms, or a benzyl group is preferable, a methyl group, an ethyl group, a propyl group, a butyl group, or a hydroxyethyl group is more preferable, and a methyl group or an ethyl group is even more preferable.

As the cation represented by Formula (1), a tetramethylammonium cation, a tetraethylammonium cation, an ethyltrimethylammonium cation, a tetrabutylammonium cation, a trimethyl(2-hydroxyethyl)ammonium cation, a dimethyldi (2-hydroxyethyl)ammonium cation, a methyltri(2-hydroxyethyl)ammonium cation, a tetra(2-hydroxyethyl)ammonium cation, or a trimethylbenzylammonium cation is preferable, and a tetramethylammonium cation, a tetraethylammonium cation, an ethyltrimethylammonium cation, or a tetrabutylammonium cation is more preferable.

Furthermore, as the cation represented by Formula (1), the quaternary ammonium cation contained in quaternary ammonium hydroxide described in JP2015-518068A is also preferable.

The quaternary ammonium compound added to the chemical solution for incorporating the quaternary ammonium cation into the chemical solution is not particularly limited, as long as the compound contains the quaternary ammonium cation described above and generates the quaternary ammonium cation by being dissociated in a solution (preferably an aqueous solution) of hypochlorous acids.

Examples of the quaternary ammonium compound include quaternary ammonium hydroxide, quaternary ammonium fluoride, quaternary ammonium chloride, quaternary ammonium bromide, quaternary ammonium iodide, quaternary ammonium acetate, and quaternary ammonium carbonate. Among these, quaternary ammonium hydroxide or quaternary ammonium chloride is preferable, and quaternary ammonium hydroxide is more preferable.

As the quaternary ammonium hydroxide, a compound containing the cation represented by Formula (1) and a hydroxide ion is preferable, tetramethylammonium hydroxide (TMAH), tetraethylammonium hydroxide (TEAH), ethyltrimethylammonium hydroxide (ETMAH), tetrapropylammonium hydroxide (TPAH), tetrabutylammonium hydroxide (TBAH), trimethyl(2-hydroxyethyl)ammonium hydroxide (choline), dimethyldi(2-hydroxyethyl)ammonium hydroxide, methyltri(2-hydroxyethyl)ammonium hydroxide, tetra(2-hydroxyethyl)ammonium hydroxide, or trimethylbenzylammonium hydroxide is more preferable, and TMAH, TEAH, ETMAH, TPAH, or TBAH is even more preferable.

In addition, as the quaternary ammonium hydroxide, the quaternary ammonium hydroxide described in JP2015-518068A may also be used.

As a quaternary ammonium compound other than the quaternary ammonium hydroxide, a compound in which the hydroxide ion (OH⁻) of the aforementioned preferred quaternary ammonium hydroxide is replaced with a corresponding anion is preferable.

As the quaternary ammonium chloride, a compound in which the hydroxide ion (OH⁻) of the aforementioned preferred quaternary ammonium hydroxide is replaced with a chloride ion (Cl⁻) is preferable, and tetramethylammonium chloride, tetraethylammonium chloride, ethyltrimethylammonium chloride, tetrapropylammonium chloride, or tetrabutylammonium chloride is more preferable. —Quaternary Phosphonium Cation—

The quaternary phosphonium cation is not particularly limited as long as it is a cation formed by the substitution of a phosphorus atom with 4 hydrocarbon groups. As the quaternary phosphonium cation, a cation represented by Formula (2) is preferable.

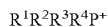  Formula (2)

In Formula (2), $R^1$, $R^2$, $R^3$, and $R^4$ each independently represent a hydrocarbon group having 1 to 18 carbon atoms that may have a substituent.

Examples of the hydrocarbon group include an aliphatic hydrocarbon group, an aromatic hydrocarbon group, and a hydrocarbon group obtained by combining an aliphatic hydrocarbon group and an aromatic hydrocarbon group. The aliphatic hydrocarbon group having 2 or more carbon atoms may have an unsaturated bond.

As the hydrocarbon group, an alkyl group having 1 to 10 carbon atoms (more preferably an alkyl group having 1 to 4 carbon atoms), a phenyl group, a naphthyl group, a benzyl group, or a naphthylmethyl group is preferable.

Examples of the substituent that the hydrocarbon group has include an alkyl (preferably alkyl having 1 to 6 carbon atoms) carbonyl group, a formyl group, an alkoxy group (preferably an alkoxy group having 1 to 6 carbon atoms), a halogen atom, a cyano group, and a silyl group. Among these, a methylcarbonyl group, a formyl group, a methoxy group, an ethoxy group, a chlorine atom, or a cyano group is preferable.

In Formula (2), at least one of $R^1$, $R^2$, $R^3$, or $R^4$ is preferably an alkyl group having 4 to 10 carbon atoms or a phenyl group, and more preferably a phenyl group.

Examples of the quaternary phosphonium cation include a acetonyltriphenylphosphonium cation, an allyltriphenylphosphonium cation, a benzyltriphenylphosphonium cation, a trans-2-butene-1,4-bis(triphenylphosphonium cation), a (4-chlorobenzyl)triphenylphosphonium cation, a (2-chlorobenzyl)triphenylphosphonium cation, a (chloromethyl)triphenylphosphonium cation, a (cyanomethyl)triphenylphosphonium cation, a (2,4-dichlorobenzyl)triphenylphosphonium cation, a (formylmethyl)triphenylphosphonium cation, a (methoxymethyl)triphenylphosphonium cation, a (1-naphthylmethyl)triphenylphosphonium cation, a tetrabutylphosphonium cation, a tetraphenylphosphonium cation, a tributyl(cyanomethyl)phosphonium cation, and a 2-(trimethylsilyl)ethoxymethyltriphenylphosphonium cation.

Among these, an acetonyltriphenylphosphonium an cation, allyltriphenylphosphonium cation, a benzyltriphenylphosphonium cation, a tetrabutylphosphonium cation, a tetraphenylphosphonium cation, or a tributyl(cyanomethyl) phosphonium cation is preferable, and an acetonyltriphenylphosphonium cation, an allyltriphenylphosphonium cation, a benzyltriphenylphosphonium cation, a tetrabutylphosphonium cation, or a tetraphenylphosphonium cation is more preferable.

The quaternary phosphonium compound added to the chemical solution for the purpose of incorporating the quaternary phosphonium cation into the chemical solution is not particularly limited, as long as the compound contains the quaternary phosphonium cation described above and generates the quaternary phosphonium cation by being dissociated in a solution (preferably an aqueous solution) of hypochlorous acids.

Examples of the quaternary phosphonium compound include quaternary phosphonium hydroxide, quaternary phosphonium fluoride, quaternary phosphonium chloride, quaternary phosphonium bromide, quaternary phosphonium iodide, quaternary phosphonium acetate, and quaternary phosphonium carbonate. Among these, quaternary phosphonium hydroxide or quaternary phosphonium chloride is preferable, and quaternary phosphonium chloride is more preferable.

As the quaternary phosphonium chloride, a compound containing the cation represented by Formula (2) and a chloride ion (CO is preferable, acetonyltriphenylphosphonium chloride, allyltriphenylphosphonium chloride, benzyltriphenylphosphonium chloride, tetrabutylphosphonium chloride, tetraphenylphosphonium chloride, or tributyl(cyanomethyl)phosphonium chloride is more preferable, acetonyltriphenylphosphonium chloride, allyltriphenylphosphonium chloride, benzyltriphenylphosphonium chloride, tetrabutylphosphonium chloride, or tetraphenylphosphonium chloride is even more preferable.

Although the specific cation may be any of the quaternary ammonium cation or the quaternary phosphonium cation, it is preferable that the chemical solution contains at least the quaternary ammonium cation as the specific cation.

In view of further improving the smoothness of the portion to be treated, the content of the specific cation in the chemical solution (total content in a case where the chemical solution contains a plurality of specific cations, the same is true of the following description) with respect to the total mass of the chemical solution is preferably equal to or higher than 1 ppm by mass, more preferably equal to or higher than 0.001% by mass, and even more preferably equal to or higher than 0.005% by mass. The upper limit of the content is not particularly limited. However, in view of further improving the dissolving ability of the chemical solution, the upper limit of the content with respect to the total mass of the chemical solution is preferably equal to or lower than 1% by mass, and even more preferably equal to or lower than 0.5% by mass.

In view of further improving the dissolving ability of the chemical solution, the ratio (mass ratio) of the content of the hypochlorous acids to the content of the specific cation in the chemical solution is preferably equal to or higher than $1\times10^{-2}$, and more preferably equal to or higher than $1\times10^{-1}$. Furthermore, in view of further improving the smoothness of the portion to be treated, the ratio (mass ratio) of the content of the hypochlorous acids to the content of the specific cation is preferably equal to or lower than $1\times10^{5}$, more preferably equal to or lower than $1\times10^{4}$, and even more preferably equal to or lower than $2\times10^{2}$.

(pH Adjuster)

The chemical solution may contain a pH adjuster.

Examples of the pH adjusters include an inorganic acid, an organic acid, an organic base, and an inorganic base.

The type of the pH adjuster to be used may be appropriately selected and the content thereof may be appropriately adjusted, so that the pH of the chemical solution falls into the preferred range which will be described later.

One kind of pH adjuster may be used singly, or two or more kinds of pH adjusters may be used.

Specific examples of the inorganic acid and the organic acid include sulfuric acid, acetic acid, nitric acid, phosphoric acid, and hydrofluoric acid. Among these, sulfuric acid, nitric acid, or hydrofluoric acid is preferable, and sulfuric acid is more preferable.

The sulfuric acid means $H_2SO_4$, the acetic acid means $CH_3COOH$, the nitric acid means $HNO_3$, the phosphoric acid means $H_3PO_4$, and the hydrofluoric acid means an aqueous solution obtained by dissolving HF in water.

Specific examples of the organic base and the inorganic base include aqueous ammonia, a water-soluble amine, an alkali metal hydroxide, and an alkali earth metal hydroxide.

The chemical solution may contain the aforementioned quaternary ammonium hydroxide as an organic base. In other words, in a case where the chemical solution contains the quaternary ammonium hydroxide, the quaternary ammonium hydroxide functions as both the specific cation supply source and pH adjuster.

In the present specification, the water-soluble amine means an amine which can dissolve in an amount equal to or greater than 50 g in 1 L of water. Aqueous ammonia is not included in the water-soluble amine.

Examples of the water-soluble amine include diglycolamine (DGA), methylamine, ethylamine, propylamine, butylamine, pentylamine, ethanolamine, propanolamine, butanolamine, methoxyethylamine, methoxypropylamine, dimethylamine, diethylamine, dipropylamine, trimethylamine, and triethylamine. As the water-soluble amine, unsubstituted hydroxylamine and a hydroxylamine derivative may also be used.

Examples of the alkali metal hydroxide and the alkali earth metal hydroxide include lithium hydroxide, sodium hydroxide, potassium hydroxide, and calcium hydroxide.

In a case where an organic base or an inorganic base is used as the pH adjuster, the quaternary ammonium hydroxide or the water-soluble amine is preferable because this compound hardly affects the electrical characteristics of a semiconductor device and exhibits low reactivity with the hypochlorous acids.

(Solvent)

The chemical solution may contain a solvent.

Examples of the solvent include water and an organic solvent. Among these, water is preferable.

Water may contain a trace of components that are unavoidably mixed in. Particularly, water having undergone a purification treatment such as distilled water, deionized water, or ultrapure water is preferable, and ultrapure water used for manufacturing semiconductors is more preferable.

The concentration of water in the chemical solution is not particularly limited, but is preferably equal to or higher than 60% by mass, more preferably equal to or higher than 70% by mass, and even more preferably equal to or higher than 97% by mass. The upper limit thereof is not particularly limited, but is preferably equal to or lower than 99.9% by mass, and more preferably equal to or lower than 99% by mass.

The chemical solution may contain components (other components) in addition to the components described above.

Those other components are not particularly limited, and examples thereof include known components. Examples of the components include the surfactants described in paragraph "0026" of JP2014-093407A, paragraphs "0024" to "0027" of JP2013-055087A, paragraphs "0024" to "0027" of JP2013-012614A, and the like.

Examples thereof also include the additives (anticorrosive and the like) disclosed in paragraphs "0017" to "0038" of JP2014-107434A, paragraphs "0033" to "0047" of JP2014-103179A, paragraphs "0017" to "0049" of JP2014-093407A, and the like.

The pH of the chemical solution is not particularly limited and is, for example, equal to or lower than 13.0. Especially, in view of further improving the balance between the dissolving ability of the chemical solution and the smoothness of the portion to be treated, the pH of the chemical solution is preferably equal to or lower than 10.0, more preferably higher than 7.0 and lower than 9.0, and even more preferably 7.5 to 8.5.

That is, in a case where the chemical solution contains a pH adjuster, the content of the pH adjuster is preferably an amount in which the pH of the chemical solution falls into the above range.

In the present specification, the pH of the chemical solution is a value measured at room temperature (25° C.) by using a pH meter (F-71S (product number), manufactured by Horiba, Ltd.).

The method for preparing the chemical solution is not particularly limited, and examples thereof include a method of thoroughly mixing together predetermined raw materials by using a stirrer such as a mixer.

Examples of the preparation method include a method of adjusting the pH to a preset value and then performing mixing and a method of performing mixing and then adjusting the pH to a preset value. Furthermore, it is also possible to use a method of manufacturing a concentrated solution and then adjusting the concentration thereof to a predetermined value by diluting the solution at the time of use. In addition, the concentrated solution can be used after being diluted and then adjusted to a preset pH. Moreover, a preset amount of water for dilution can be added to the concentrated solution, or a predetermined amount of the concentrated solution can be added to water for dilution.

<Object to be Treated>

The chemical solution is used for removing a transition metal-containing substance on a substrate.

In the present specification, "on a substrate" includes, for example, all of the front and back, the lateral surfaces, and the inside of grooves of a substrate, and the like. The transition metal-containing substance on a substrate contains not only a transition metal-containing substance which directly contacts the surface of the substrate but also a transition metal-containing substance which is on the substrate through another layer.

Examples of the transition metal contained in the transition metal-containing substance include a metal M selected from Ru (ruthenium), Rh (rhodium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

That is, as the transition metal-containing substance, a substance containing the metal M is preferable.

Particularly, as the transition metal-containing substance, a Ru-containing substance is more preferable. That is, the chemical solution is more preferably used for removing the Ru-containing substance.

The content of Ru atoms in the Ru-containing substance with respect to the total mass of the Ru-containing substance is preferably equal to or higher than 10% by mass, more preferably equal to or higher than 30% by mass, even more preferably equal to or higher than 50% by mass, and particularly preferably equal to or higher than 90% by mass. The upper limit thereof is not particularly limited, and is 100% by mass for example.

The transition metal-containing substance only needs to be a substance containing a transition metal (transition metal atoms), and examples thereof include a simple transition metal, an alloy containing a transition metal, an oxide of a transition metal, a nitride of a transition metal, and an oxynitride of a transition metal. Among these, as the transition metal-containing substance, simple Ru, an alloy of Ru, an oxide of Ru, a nitride of Ru, or an oxynitride of Ru is preferable.

The oxide, nitride, and oxynitride described above may be a composite oxide, a composite nitride, and a composite oxynitride containing a transition metal.

The content of transition metal atoms in the transition metal-containing substance with respect to the total mass of the transition metal-containing substance is preferably equal to or higher than 10% by mass, more preferably equal to or higher than 30% by mass, and even more preferably equal to or higher than 50% by mass. The upper limit thereof is 100% by mass because the transition metal-containing substance may be a transition metal.

The object to be treated is a substrate having a transition metal-containing substance. That is, the object to be treated includes at least a substrate and a transition metal-containing substance on the substrate.

The type of the substrate is not particularly limited, but is preferably a semiconductor substrate.

Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The use of the object to be treated that has been treated with the chemical solution is not particularly limited. For example, such an object to be treated may be used in dynamic random access memory (DRAM), ferroelectric random access memory (FRAM, registered trademark), magnetoresistive random access memory (MRAM), and phase change random access memory (PRAM) or used in a logic circuit, a processor, and the like.

The type of the transition metal-containing substance on the substrate is as described above.

The form of the transition metal-containing substance on the substrate is not particularly limited. For example, the transition metal-containing substance may be disposed in the form of a film (transition metal-containing film), in the form of wiring (transition metal-containing wiring), or in the form of particles. As described above, the transition metal is preferably Ru, and the object to be treated preferably includes a substrate and a Ru-containing film, Ru-containing wiring, or a particle-like Ru-containing substance which is disposed on the substrate.

Examples of the substrate, on which the transition metal-containing substance is disposed in the form of particles, include a substrate obtained by performing dry etching on a substrate on which a transition metal-containing film is disposed so that particle-like transition metal-containing substances are then attached to the substrate as residues as will be described later, and a substrate obtained by performing a chemical mechanical polishing (CMP) treatment on the transition metal-containing film so that particle-like transition metal-containing substances are then attached to the substrate as residues as will be described later.

The thickness of the transition metal-containing film is not particularly limited, and may be appropriately selected according to the use. For example, the thickness is preferably equal to or smaller than 50 nm, more preferably equal to or smaller than 20 nm, and even more preferably equal to or smaller than 10 nm.

The transition metal-containing film may be disposed only on one of the main surfaces of the substrate, or may be disposed on both the main surfaces of the substrate. Furthermore, the transition metal-containing film may be disposed on the entire main surface of the substrate, or may be disposed on a portion of the main surface of the substrate.

The object to be treated may include various layers and/or structures as desired in addition to the transition metal-containing substance. For example, metal wiring, a gate electrode, a source electrode, a drain electrode, an insulating layer, a ferromagnetic layer, and/or a non-magnetic layer, and the like may be disposed on the substrate.

The substrate may include the structure of an exposed integrated circuit, for example, an interconnection mechanism such as metal wiring and a dielectric material. Examples of metals and alloys used for the interconnection mechanism include aluminum, a copper-aluminum alloy, copper, titanium, tantalum, cobalt, silicon, titanium nitride, tantalum nitride, and tungsten. The substrate may include a layer of silicon oxide, silicon nitride, silicon carbide, and/or carbon-doped silicon oxide.

The size, thickness, shape, layer structure, and the like of the substrate are not particularly limited, and can be appropriately selected as desired.

As described above, the object to be treated used in the treatment method according to the embodiment of the present invention has a transition metal-containing substance on a substrate.

The method for manufacturing the object to be treated is not particularly limited. For example, a transition metal-containing film can be formed on the substrate by a sputtering method, a chemical vapor deposition (CVD) method, a molecular beam epitaxy (MBE) method, or the like. In a case where the transition metal-containing film is formed by a sputtering method, a CVD method, or the like, sometimes the transition metal-containing substance is also attached to the back surface of the substrate on which the transition metal-containing film is disposed (the surface opposite to the side of the transition metal-containing film).

Furthermore, transition metal-containing wiring may be formed on a substrate by performing the aforementioned method through a predetermined mask.

In addition, a substrate on which a transition metal-containing film or transition metal-containing wiring is disposed and which has undergone a predetermined treatment may also be used as an object to be treated by the treatment method.

For example, by performing dry etching on a substrate on which a transition metal-containing film or transition metal-containing wiring is disposed, a substrate having dry etching residues containing a transition metal may be manufactured. Furthermore, by performing CMP on a substrate on which a transition metal-containing film or transition metal-containing wiring is disposed, a substrate having a transition metal-containing substance may be manufactured.

[Method for Treating Substrate]

The method for treating a substrate (hereinafter, also called "present treatment method") includes a step A of removing a transition metal-containing substance on a substrate by using the chemical solution described above.

As described above, it is preferable to use the present treatment method in a case where the transition metal-containing substance contains the Ru-containing substance.

The chemical solution used in the present treatment method is as described above.

In addition, the substrate containing a transition metal-containing substance, which is an object to be treated by the present treatment method, is as described above.

Examples of the specific method of the step A include a method of bringing the substrate as an object to be treated, on which a transition metal-containing substance is disposed, into contact with the chemical solution.

The method of bringing the substrate into contact with the chemical solution is not particularly limited, and examples thereof include a method of immersing the object to be treated in the chemical solution put in a tank, a method of spraying the chemical solution onto the object to be treated, a method of causing the chemical solution to flow on the object to be treated, and any combination of these. Among these, the method of immersing the object to be treated in the chemical solution is preferable.

In order to further enhance the cleaning ability of the chemical solution, a mechanical stirring method may also be used.

Examples of the mechanical stirring method include a method of circulating the chemical solution on an object to be treated, a method of causing the chemical solution to flow on the object to be treated or spraying the chemical solution onto the object to be treated, a method of stirring the chemical solution by using ultrasonic or megasonic waves, and the like.

The treatment time of the step A can be appropriately adjusted. The treatment time (the contact time between the chemical solution and the object to be treated) is not particularly limited, but is preferably 0.25 to 10 minutes, and more preferably 0.5 to 2 minutes.

The temperature of the chemical solution during the treatment is not particularly limited, but is preferably 20° C. to 75° C., more preferably 20° C. to 60° C., even more preferably 40° C. to 65° C., and particularly preferably 50° C. to 65° C.

In the step A, a treatment may be performed in which the concentration of the hypochlorous acids and/or the specific anion in the chemical solution is measured and, if necessary, a solvent (preferably water) is added to the chemical solution. In a case where this treatment is performed, the concentration of components in the chemical solution can be stably maintained in a predetermined range.

Specifically, examples of suitable embodiments of the step A include a step A1 of performing a recess etching treatment on transition metal-containing wiring disposed on a substrate by using the chemical solution, a step A2 of removing a transition metal-containing film on outer edges of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, and a step A5 of removing a transition metal-containing substance on a substrate, which has undergone a chemical mechanical polishing treatment, by using the chemical solution.

Among these, as the step A, the step A2 or the step A3 is more preferable.

Hereinafter, the present treatment method used in each of the above treatments will be described.

<Step A1>

Examples of the step A include a step A1 of performing a recess etching treatment on transition metal-containing wiring disposed on a substrate by using the chemical solution.

FIG. 1 is a schematic cross-sectional top view showing an example of a substrate including transition metal-containing wiring (hereinafter, also called "wiring substrate") which is an object to be treated by the recess etching treatment in the step A1.

A wiring substrate 10a shown in FIG. 1 has a substrate not shown in the drawing, an insulating film 12 including a groove disposed on the substrate, a barrier metal layer 14 disposed along the inner wall of the groove, and transition metal-containing wiring 16 that fills up the inside of the groove.

The substrate and the transition metal-containing wiring in the wiring substrate are as described above.

As the transition metal-containing wiring, Ru-containing wiring (wiring containing Ru) is preferable. It is preferable that the Ru-containing wiring contains simple Ru, an alloy of Ru, an oxide of Ru, a nitride of Ru, or an oxynitride of Ru.

The material constituting the barrier metal layer in the wiring substrate is not particularly limited, and examples thereof include TiN and TaN.

In FIG. 1, an embodiment is illustrated in which the wiring substrate has a barrier metal layer. However, the wiring substrate may not include the barrier metal layer.

The method for manufacturing the wiring substrate is not particularly limited, and examples thereof include a method including a step of forming an insulating film on a substrate, a step of forming a groove in the insulating film, a step of forming a barrier metal layer on the insulating film, a step of forming a transition metal-containing film that fills up the groove, and a step of performing a smoothing treatment on the transition metal-containing film.

In the step A1, by performing a recess etching treatment on the transition metal-containing wiring in the wiring substrate by using the aforementioned chemical solution, a portion of the transition metal-containing wiring can be removed, and a recess can be formed.

Figure 2:
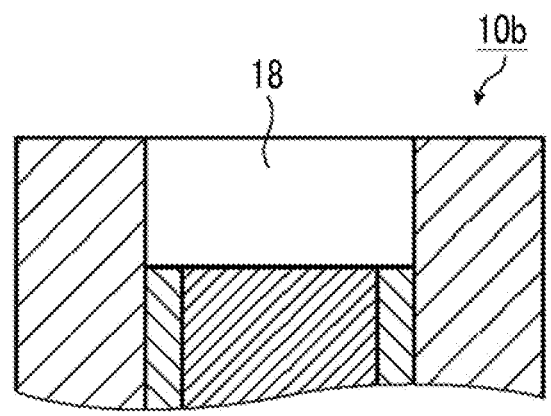
FIG. 2 is a schematic cross-sectional top view showing an example of an object to be treated having undergone the step A1.

More specifically, in a case where the step A1 is performed, as shown in the wiring substrate 10b in FIG. 2, a portion of the barrier metal layer 14 and the transition metal-containing wiring 16 is removed, and a recess 18 is formed.

Examples of the specific method of the step A1 include a method of bringing the wiring substrate into contact with the chemical solution.

The method of bringing the wiring substrate into contact with the chemical solution is as described above.

The suitable ranges of the contact time between the chemical solution and the wiring substrate and the temperature of the chemical solution are as described above.

(Step B)

Before or after the step A1, if necessary, a step B of treating the substrate obtained by the step A1 by using a predetermined solution (hereinafter, also called "specific solution") may be performed.

Particularly, as described above, in a case where the barrier metal layer is disposed on the substrate, sometimes the solubility in the chemical solution varies between the component constituting the transition metal-containing wiring and the component constituting the barrier metal layer depending on the type of the components. In this case, it is preferable to adjust the degree of solubility of the transition metal-containing wiring and the barrier metal layer by using a solution that dissolves better the barrier metal layer.

In this respect, as the specific solution, a solution is preferable which poorly dissolves the transition metal-containing wiring but excellently dissolves the substance constituting the barrier metal layer.

Examples of the specific solution include a solution selected from the group consisting of a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), and a mixed solution of hydrochloric acid and aqueous hydrogen peroxide (HPM).

The composition of FPM is, for example, preferably in a range of "hydrofluoric acid:aqueous hydrogen peroxide:water=1:1:1" to "hydrofluoric acid:aqueous hydrogen peroxide:water=1:1:200" (volume ratio).

The composition of SPM is, for example, preferably in a range of "sulfuric acid:aqueous hydrogen peroxide:water=3:1:0" to "sulfuric acid:aqueous hydrogen peroxide:water=1:1:10" (volume ratio).

The composition of APM is, for example, preferably in a range of "aqueous ammonia:aqueous hydrogen peroxide:water=1:1:1" to "aqueous ammonia:aqueous hydrogen peroxide:water=1:1:30" (volume ratio).

The composition of HPM is, for example, preferably in a range of "hydrochloric acid:aqueous hydrogen peroxide:water=1:1:1" to "hydrochloric acid:aqueous hydrogen peroxide:water=1:1:30" (volume ratio).

The preferred compositional ratio described above means a compositional ratio determined in a case where the content of hydrofluoric acid is 49% by mass, the content of sulfuric acid is 98% by mass, the content of aqueous ammonia is 28% by mass, the content of hydrochloric acid is 37% by mass, and the content of aqueous hydrogen peroxide is 31% by mass.

Among these, in view of dissolving ability for the barrier metal layer, SPM, APM, or HPM is preferable.

In view of reducing roughness, APM, HPM, or FPM is preferable, and APM is more preferable.

In view of achieving excellent balance between performances, APM or HPM is preferable.

In the step B, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the chemical solution.

The contact time between the specific solution and the substrate obtained by the step A1 is, for example, preferably 0.25 to 10 minutes, and more preferably 0.5 to 5 minutes.

In the present treatment method, the step A1 and the step B may be alternately repeated.

In a case where the steps are alternately repeated, it is preferable that each of the step A1 and the step B is performed 1 to 10 times. Furthermore, in a case where the step A1 and the step B are alternately repeated, the step performed firstly and the step performed lastly may be any of the step A1 or the step B.

<Step A2>

Examples of the step A include a step A2 of removing a transition metal-containing film at the outer edge of a substrate, on which the transition metal-containing film is disposed, by using the chemical solution.

Figure 3:
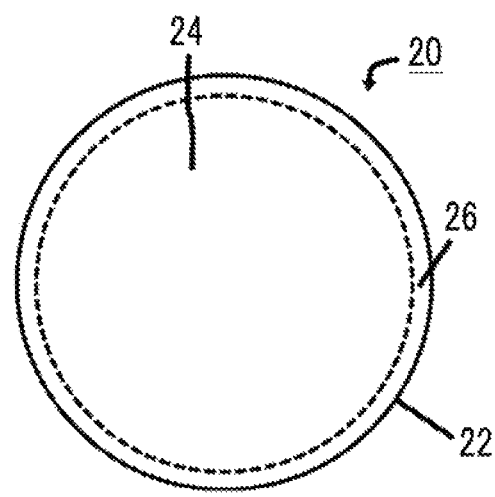
FIG. 3 is a schematic view showing an example of an object to be treated used in a step A2.

FIG. 3 is a schematic view (top view) showing an example of a substrate, on which a transition metal-containing film is disposed, as an object to be treated by the step A2.

An object 20 to be treated by the step A2 shown in FIG. 3 is a laminate including a substrate 22 and a transition metal-containing film 24 disposed on one main surface (entire region surrounded by the solid line) of the substrate 22. As will be described later, in step A2, the transition metal-containing film 24 positioned at an outer edge 26 (the region outside the broken line) of the object 20 to be treated is removed.

The substrate and the transition metal-containing film in the object to be treated are as described above.

As the transition metal-containing film, a Ru-containing film (film containing Ru) is preferable. It is preferable that the Ru-containing film contains simple Ru, an alloy of Ru, an oxide of Ru, a nitride of Ru, or an oxynitride of Ru.

The specific method of the step A2 is not particularly limited, and examples thereof include a method of supplying the chemical solution from a nozzle so that the chemical solution contacts only the transition metal-containing film at the outer edge of the substrate.

At the time of performing the treatment of the step A2, it is possible to preferably use the substrate treatment device and the substrate treatment method described in JP2010-267690A, JP2008-080288A, JP2006-100368A, and JP2002-299305A.

The method of bringing the object to be treated into contact with the chemical solution is as described above.

The suitable ranges of the contact time between the chemical solution and the object to be treated and the temperature of the chemical solution are as described above.

<Step A3>

Examples of the step A include a step A3 of removing a transition metal-containing substance attached to the back surface of a substrate, on which a transition metal-containing film is disposed, by using the chemical solution.

Examples of the object to be treated by the step A3 include the object to be treated used in the step A2. At the time of forming the object to be treated, which is constituted with a substrate and a transition metal-containing film disposed on one main surface of the substrate, used in the step A2, the transition metal-containing film is formed by sputtering, CVD, or the like. At this time, sometimes a transition metal-containing substance is attached to a surface (back surface) of the substrate that is opposite to the transition metal-containing film. The step A3 is performed to remove such a transition metal-containing substance in the object to be treated.

The specific method of the step A3 is not particularly limited, and examples thereof include a method of spraying the chemical solution so that the chemical solution contacts only the back surface of the substrate.

The method of bringing the object to be treated into contact with the chemical solution is as described above.

The suitable ranges of the contact time between the chemical solution and the object to be treated and the temperature of the chemical solution are as described above.

<Step A4>

Examples of the step A include a step A4 of removing a transition metal-containing substance on a substrate, which has undergone dry etching, by using the chemical solution.

Figure 4:
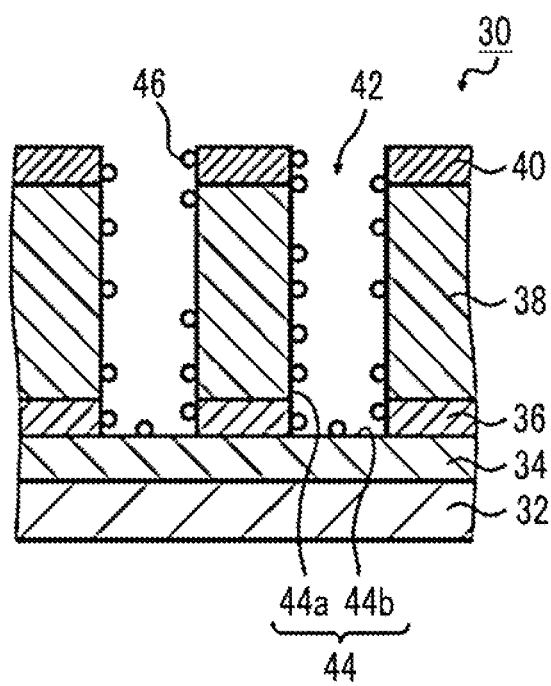
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a transition metal-containing film 34, an etch stop layer 36, an interlayer insulating film 38, a metal hard mask 40 in this order on a substrate 32. Through a dry etching process or the like, a hole 42 exposing the transition metal-containing film 34 is formed at a predetermined position. That is, the object to be treated shown in FIG. 4 is a laminate which comprises the substrate 32, the transition metal-containing film 34, the etch stop layer 36, the interlayer insulating film 38, and the metal hard mask 40 in this order and comprises the hole 42 that extends from the surface of the metal hard mask 40 to the surface of the transition metal-containing film 34 at the position of the opening portion of the mask 40. An inner wall 44 of the hole 42 is constituted with a cross-sectional wall 44a which includes the etch stop layer 36, the interlayer insulating film 38, and the metal hard mask 40, and a bottom wall 44b which includes the exposed transition metal-containing film 34. A dry etching residue 46 is attached to the inner wall 44.

The dry etching residue contains a transition metal-containing substance.

As the transition metal-containing film, a Ru-containing film (film containing Ru) is preferable. It is preferable that the Ru-containing film contains simple Ru, an alloy of Ru, an oxide of Ru, a nitride of Ru, or an oxynitride of Ru.

As the transition metal-containing substance, a Ru-containing substance is preferable. It is preferable that the Ru-containing substance contains simple Ru, an alloy of Ru, an oxide of Ru, a nitride of Ru, or an oxynitride of Ru.

As the interlayer insulating film and the metal hard mask, known materials are selected.

Although FIG. 4 describes an embodiment in which a metal hard mask is used, a resist mask formed of a known photoresist material may also be used.

Examples of the specific method of the step A4 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

<Step A5>

Examples of the step A include a step A5 of removing a transition metal-containing substance on a substrate, which has undergone a chemical mechanical polishing (CMP), by using the chemical solution.

The CMP technique is used for smoothing an insulating film, smoothing connection holes, and a process of manufacturing damascene wiring and the like. In some cases, a substrate having undergone CMP is contaminated with a large amount of particles used as abrasive particles, metal impurities, and the like. Therefore, it is necessary to remove these contaminants and wash the substrate before the next processing stage starts. By performing the step A5, it is possible to remove a transition metal-containing substance which is generated in a case where the object to be treated by CMP includes transition metal-containing wiring or a transition metal-containing film and attached onto the substrate.

As described above, examples of the object to be treated by the step A5 include a substrate having undergone CMP that includes a transition metal-containing substance.

As the transition metal-containing substance, a Ru-containing substance is preferable. It is preferable that the Ru-containing substance contains simple Ru, an alloy of Ru, an oxide of Ru, a nitride of Ru, or an oxynitride of Ru.

Examples of the specific method of the step A5 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

<Step C>

If necessary, the present treatment step may include a step C of performing a rinsing treatment on the substrate obtained by the step A by using a rinsing solution after the step A.

In a case where the substrate is brought into contact with the chemical solution, sometimes a chlorine compound derived from the hypochlorous acids in the chemical solution is attached to the surface of the substrate as residual chlorine (Cl residue). Such residual chlorine (Cl residue) may negatively affect the subsequent processes and/or end products. By performing the rinsing step, it is possible to remove the residual chlorine (Cl residue) from the surface of the substrate.

As the rinsing solution, for example, hydrofluoric acid (preferably 0.001% to 1% by mass hydrofluoric acid), hydrochloric acid (preferably 0.001% to 1% by mass hydrochloric acid), aqueous hydrogen peroxide (preferably 0.5% to 31% by mass aqueous hydrogen peroxide, and more preferably 3% to 15% by mass aqueous hydrogen peroxide), a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), a mixed solution of hydrochloric acid and aqueous hydrogen peroxide (HPM), aqueous carbon dioxide (preferably 10 to 60 ppm by mass aqueous carbon dioxide), aqueous ozone (preferably 10 to 60 ppm by mass aqueous ozone), aqueous hydrogen (preferably 10 to 20 ppm by mass aqueous hydrogen), an aqueous citric acid solution (preferably a 0.01% to 10% by mass aqueous citric acid solution), acetic acid (preferably an undiluted acetic acid solution or a 0.01% to 10% by mass aqueous acetic acid solution), sulfuric acid (preferably a 1% to 10% by mass aqueous sulfuric acid solution), aqueous ammonia (preferably 0.01% to 10% by mass aqueous ammonia), isopropyl alcohol (IPA), an aqueous hypochlorous acid solution (preferably a 1% to 10% by mass aqueous hypochlorous acid solution), aqua regia (preferably aqua regia obtained by mixing together "37% by mass hydrochloric acid:60% by mass nitric acid" at a volume ratio of "2.6:1.4" to "3.4:0.6"), ultrapure water, nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous oxalic acid solution), or an aqueous periodic acid solution (preferably a 0.5% to 10% by mass aqueous periodic acid solution, examples of the periodic acid include orthoperiodic acid and metaperiodic acid) is preferable.

The preferred conditions required to FPM, SPM, APM, and HPM are the same as the preferred conditions required, for example, to FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The aqueous ozone, aqueous carbon dioxide, and aqueous hydrogen mean aqueous solutions obtained by dissolving $O_3$, $CO_2$, and $H_2$ in water respectively.

As long as the purpose of the rinsing step is not impaired, these rinsing solutions may be used by being mixed together.

Among the above, as the rinsing solution, in view of further reducing chlorine remaining on the surface of the substrate after the rinsing step, aqueous carbon dioxide, aqueous ozone, aqueous hydrogen, hydrofluoric acid, an aqueous citric acid solution, hydrochloric acid, sulfuric acid, aqueous ammonia, aqueous hydrogen peroxide, SPM, APM, HPM, IPA, an aqueous hypochlorous acid solution, aqua regia, or FPM is preferable, and hydrofluoric acid, hydrochloric acid, aqueous hydrogen peroxide, SPM, APM, HPM, or FPM is more preferable.

Examples of the specific method of the step C include a method of bringing the substrate as an object to be treated obtained by the step A into contact with the rinsing solution.

The method of bringing the substrate into contact with the rinsing solution is performed by immersing the substrate in the rinsing solution put in a tank, spraying the rinsing solution onto the substrate, causing the rinsing solution to flow on the substrate, or any combination of these.

The treatment time (contact time between the rinsing solution and the object to be treated) is not particularly limited, but is 5 seconds to 5 minutes for example.

The temperature of the rinsing solution during the treatment is not particularly limited. Generally, the temperature of the rinsing solution is preferably 16° C. to 60° C., and more preferably 18° C. to 40° C. In a case where SPM is used as the rinsing solution, the temperature thereof is preferably 90° C. to 250° C.

If necessary, the present treatment method may include a step D of performing a drying treatment after the step C. The method of the drying treatment is not particularly limited, and examples thereof include spin drying, causing a drying gas to flow on the substrate, heating the substrate by heating means such as a hot plate or an infrared lamp, isopropyl alcohol (IPA) vapor drying, Marangoni drying, Rotagoni drying, and any combination of these.

The drying time varies with the specific method to be used, but is about 30 seconds to a few minutes in general.

The present treatment method may be performed in combination before or after other steps performed on a substrate. While being performed, the present treatment method may be incorporated into those other steps. Alternatively, while those other steps are being performed, the present treatment method may be incorporated into the steps and performed.

Examples of those other steps include a step of forming each structure such as metal wiring, a gate structure, a source structure, a drain structure, an insulating layer, a ferromagnetic layer and/or a non-magnetic layer (layer formation, etching, chemical mechanical polishing, modification, and the like), a step of forming resist, an exposure step and a removing step, a heat treatment step, a washing step, an inspection step, and the like.

The present treatment method may be performed in the back end process (BEOL: Back end of the line) or in the front end process (FEOL: Front end of the line). However, from the viewpoint of enabling the effects of the present invention to be further demonstrated, it is preferable to perform the present treatment method in the front end process.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples.

[Preparation of Chemical Solution]

An aqueous solution (mixed solution) containing hypochlorous acids at a predetermined concentration was prepared, and then a supply source of the specific anion and a pH adjuster were further added thereto, thereby preparing a chemical solution formulated as shown in Table 1.

The hypochlorous acids, the compounds used as supply sources of the specific anion and/or the specific cation, and the pH adjuster used for preparing the chemical solution will be shown below. All the raw materials used for preparing the chemical solution were semiconductor grade high-purity raw materials.

(Hypochlorous Acids)
NaClO: sodium hypochlorite
KClO: potassium hypochlorite
$Ca(ClO)_2$: calcium hypochlorite
HClO: hypochlorous acid
(Supply Source of Specific Anion and/or Specific Cation)
$HClO_3$: chloric acid
$NaClO_3$: sodium chlorate
$KClO_3$: potassium chlorate
HCl: hydrochloric acid
NaCl: sodium chloride
KCl: potassium chloride
$N(CH_3)_4Cl$: tetramethylammonium chloride
$N(C_2H_5)_4Cl$: tetraethylammonium chloride
$N(C_2H_5)(CH_3)_3Cl$: ethyltrimethylammonium chloride
$N(C_3H_7)_4Cl$: tetrapropylammonium chloride
$P(C_6H_5)_4Cl$: tetraphenylphosphonium chloride
(pH Adjuster)
Sulfuric acid (95% by mass sulfuric acid)
Nitric acid (60% by mass nitric acid)
Hydrofluoric acid (49% by mass hydrofluoric acid)
TMAH: tetramethylammonium hydroxide
TEAH: tetraethylammonium hydroxide
ETMAH: ethyltrimethylammonium hydroxide
TBAH: tetrabutylammonium hydroxide The amount of the supply source of each of the specific anions added is set so that the content of each of the specific anions with respect to the total mass of the chemical solution was the value described in the column of "Content" of the column of "$ClO_3^-$" or in the column of "Content" of the column of "$Cl^-$".

Furthermore, the amount of the supply source of the specific cation added was set so that the content of the specific cation with respect to the total mass of the chemical solution was the value described in the column of "Content" of the column of "Specific cation". The amount of the pH adjuster added was set so that the pH of the chemical solution was the value described in the column of "pH of chemical solution". In a case where the pH adjuster also functions as the supply source of the specific cation, the content of the specific cation contained in the chemical solution obtained after the addition of the pH adjuster is described in the column of "Content" of the column of "Specific cation".

The rest (balance) of the chemical solution other than the components described in the table is water.

[Test]

Substrates were prepared in which a ruthenium layer was formed on one surface of a commercial silicon wafer (diameter: 12 inches) by a chemical vapor deposition (CVD) method. The thickness of the ruthenium layer was 15 nm.

Each of the obtained substrates was put in a container filled with a chemical solution, and the chemical solution was stirred to perform a ruthenium layer removal treatment. The temperature of the chemical solution was 60° C.

[Evaluation]

<Dissolving Ability>

The time taken for the ruthenium layer to disappear (time required for removal) was measured, and the dissolving ability of the chemical solution was evaluated based on the following standard.

The shorter the time required for removal, the better the dissolving ability of the chemical solution.

A: Time required for removal≤30 seconds
B: 30 seconds<time required for removal≤45 seconds
C: 45 seconds<time required for removal≤60 seconds
D: 60 seconds<time required for removal≤120 seconds
E: 120 seconds<time required for removal <Smoothness>

At a point in time when the removal treatment had been performed for half of the time required for removal checked in the evaluation of dissolving ability, the removal treatment was stopped, the surface of the ruthenium layer was observed with a scanning electron microscope, and the smoothness of the portion to be treated was evaluated based on the following standard.

In a case where a chemical solution graded E by the evaluation of dissolving ability was used, at a point in time when the removal treatment had been performed for 120 seconds, the surface of the ruthenium layer was observed with a scanning electron microscope, and the smoothness was evaluated.

A: The surface of the ruthenium layer is smooth and has no roughness.
B: The surface of the ruthenium layer is smooth and substantially has no roughness.
C: The surface of the ruthenium layer is smooth and has slight roughness (having roughness higher than that in B).
D: The surface of the ruthenium layer is rough, but the roughness is at an acceptable level.
E: The surface of the ruthenium layer is rough.

The results are shown in Table 1.

In Table 1, "E+n (n is an integer)" and "E−n (n is an integer)" mean "$\times 10^{+n}$" and "$\times 10^{-n}$" respectively.

The column of "Hypochlorous acids/specific anion" shows the mass ratio of the content of the hypochlorous acids to the content (total content in a case where the chemical solution contains both of $ClO_3^-$ and $Cl^-$) of the specific anion in the chemical solution.

The column of "Hypochlorous acids/specific cation" shows the mass ratio of the content of the hypochlorous acids to the content of the specific cation in the chemical solution.

TABLE 1

| | Composition of chemical solution | | | | | | | | |
|---|---|---|---|---|---|---|---|---|---|
| | Hypochlorous acids | | Specific anion | | | | Specific cation | | |
| | | | $ClO_3^-$ | | $Cl^-$ | | | | |
| | Type | Content (% by mass) | Supply source | Content (% by mass) | Supply source | Content (% by mass) | Supply source | Content (% by mass) | pH adjuster |
| Example 1 | NaClO | 1.0 | $HClO_3$ | 1.0 | N/A | — | N/A | — | N/A |
| Example 2 | NaClO | 1.0 | $HClO_3$ | 0.1 | N/A | — | N/A | — | N/A |
| Example 3 | NaClO | 5.0 | $HClO_3$ | 0.5 | N/A | — | N/A | — | N/A |
| Example 4 | NaClO | 15.0 | $HClO_3$ | 0.8 | N/A | — | N/A | — | N/A |
| Example 5 | NaClO | 30.0 | $HClO_3$ | 1.0 | N/A | — | N/A | — | N/A |
| Example 6 | NaClO | 1.0 | $HClO_3$ | 0.01 | N/A | — | N/A | — | N/A |
| Example 7 | NaClO | 1.0 | $NaClO_3$ | 0.01 | N/A | — | N/A | — | N/A |
| Example 8 | NaClO | 1.0 | $KClO_3$ | 0.01 | N/A | — | N/A | — | N/A |
| Example 9 | NaClO | 1.0 | $HClO_3$ | 0.001 | N/A | — | N/A | — | N/A |
| Example 10 | NaClO | 1.0 | $HClO_3$ | 0.0001 | N/A | — | N/A | — | N/A |
| Example 11 | NaClO | 1.0 | $HClO_3$ | 0.0005 | N/A | — | N/A | — | N/A |

TABLE 1-continued

| | | | | | | | | | | |
|---|---|---|---|---|---|---|---|---|---|---|
| Example 12 | NaClO | 1.0 | HClO$_3$ | 0.0000005 | N/A | — | N/A | — | N/A | |
| Example 13 | NaClO | 1.0 | N/A | — | HCl | 1.0 | N/A | — | N/A | |
| Example 14 | NaClO | 1.0 | N/A | — | HCl | 0.1 | N/A | — | N/A | |
| Example 15 | NaClO | 5.0 | N/A | — | HCl | 0.5 | N/A | — | N/A | |
| Example 16 | NaClO | 15.0 | N/A | — | HCl | 0.8 | N/A | — | N/A | |
| Example 17 | NaClO | 30.0 | N/A | — | HCl | 1.0 | N/A | — | N/A | |
| Example 18 | NaClO | 1.0 | N/A | — | HCl | 0.01 | N/A | — | N/A | |
| Example 19 | NaClO | 1.0 | N/A | — | NaCl | 0.01 | N/A | — | N/A | |
| Example 20 | NaClO | 1.0 | N/A | — | KCl | 0.01 | N/A | — | N/A | |
| Example 21 | NaClO | 1.0 | N/A | — | N(CH$_3$)$_4$Cl | 0.01 | N(CH$_3$)$_4$Cl | 0.021 | N/A | |
| Example 22 | NaClO | 1.0 | N/A | — | N(C$_2$H$_5$)$_4$Cl | 0.01 | N(C$_2$H$_5$)$_4$Cl | 0.037 | N/A | |
| Example 23 | NaClO | 1.0 | N/A | — | N(C$_2$H$_5$)(CH$_3$)$_3$Cl | 0.01 | N(C$_2$H$_5$)(CH$_3$)$_3$Cl | 0.025 | N/A | |
| Example 24 | NaClO | 1.0 | N/A | — | N(C$_3$H$_7$)$_4$Cl | 0.01 | N(C$_3$H$_7$)$_4$Cl | 0.053 | N/A | |
| Example 25 | NaClO | 1.0 | N/A | — | P(C$_6$H$_5$)$_4$Cl | 0.01 | P(C$_6$H$_5$)$_4$Cl | 0.096 | N/A | |

| | pH of chemical solution | Hypochlorous acids/ specific anion | Hypochlorous acids/ specific cation | Dissolving ability | Smoothness |
|---|---|---|---|---|---|
| Example 1 | 7.0 | 1.0E+00 | — | D | B |
| Example 2 | 10.0 | 1.0E+01 | — | C | C |
| Example 3 | 12.0 | 1.0E+01 | — | B | C |
| Example 4 | 12.5 | 1.9E+01 | — | A | C |
| Example 5 | 13.0 | 3.0E+01 | — | A | D |
| Example 6 | 11.0 | 1.0E+02 | — | B | C |
| Example 7 | 12.0 | 1.0E+02 | — | B | C |
| Example 8 | 12.0 | 1.0E+02 | — | B | C |
| Example 9 | 12.0 | 1.0E+03 | — | B | C |
| Example 10 | 12.0 | 1.0E+04 | — | B | C |
| Example 11 | 12.0 | 2.0E+03 | — | B | C |
| Example 12 | 12.0 | 2.0E+06 | — | B | D |
| Example 13 | 6.5 | 1.0E+00 | — | D | B |
| Example 14 | 9.0 | 1.0E+01 | — | C | C |
| Example 15 | 12.0 | 1.0E+01 | — | B | C |
| Example 16 | 12.5 | 1.9E+01 | — | A | C |
| Example 17 | 13.0 | 3.0E+01 | — | A | D |
| Example 18 | 11.0 | 1.0E+02 | — | B | C |
| Example 19 | 12.0 | 1.0E+02 | — | B | C |
| Example 20 | 12.0 | 1.0E+02 | — | B | C |
| Example 21 | 12.0 | 1.0E+02 | 4.8E+01 | B | A |
| Example 22 | 12.0 | 1.0E+02 | 2.7E+01 | B | A |

TABLE 1-continued

| | | | | | |
|---|---|---|---|---|---|
| Example 23 | 12.0 | 1.0E+02 | 4.0E+01 | B | A |
| Example 24 | 12.0 | 1.0E+02 | 1.9E+01 | B | A |
| Example 25 | 12.0 | 1.0E+02 | 1.0E+01 | B | A |

TABLE 2

| | Composition of chemical solution | | | | | | | |
|---|---|---|---|---|---|---|---|---|
| | hypochlorous acids | | Specific anion | | | | Specific cation | |
| | | | $ClO_3^-$ | | $Cl^-$ | | | |
| | Type | Content (% by mass) | Supply source | Content (% by mass) | Supply source | Content (% by mass) | Supply source | Content (% by mass) | pH adjuster |
| Example 26 | NaClO | 1.0 | N/A | — | HCl | 0.001 | N/A | — | N/A |
| Example 27 | NaClO | 1.0 | N/A | — | HCl | 0.0001 | N/A | — | N/A |
| Example 28 | NaClO | 1.0 | N/A | — | HCl | 0.0005 | N/A | — | N/A |
| Example 29 | NaClO | 1.0 | N/A | — | HCl | 0.0000005 | N/A | — | N/A |
| Example 30 | NaClO | 1.0 | HClO₃ | 1.0 | HCl | 1.0 | N/A | — | N/A |
| Example 31 | NaClO | 1.0 | HClO₃ | 0.1 | HCl | 0.1 | N/A | — | N/A |
| Example 32 | NaClO | 5.0 | HClO₃ | 0.5 | HCl | 0.5 | N/A | — | N/A |
| Example 33 | NaClO | 15.0 | HClO₃ | 0.8 | HCl | 0.8 | N/A | — | N/A |
| Example 34 | NaClO | 30.0 | HClO₃ | 1.0 | HCl | 1.0 | N/A | — | N/A |
| Example 35 | NaClO | 1.0 | HClO₃ | 0.01 | HCl | 0.01 | N/A | — | N/A |
| Example 36 | NaClO | 1.0 | NaClO₃ | 0.01 | NaCl | 0.01 | N/A | — | N/A |
| Example 37 | NaClO | 1.0 | HClO₃ | 0.001 | HCl | 0.001 | N/A | — | N/A |
| Example 38 | NaClO | 1.0 | HClO₃ | 0.0001 | HCl | 0.0001 | N/A | — | N/A |
| Example 39 | NaClO | 1.0 | HClO₃ | 0.0005 | HCl | 0.0005 | N/A | — | N/A |
| Example 40 | NaClO | 1.0 | HClO₃ | 0.0000005 | HCl | 0.0000005 | N/A | — | N/A |
| Example 41 | NaClO | 1.0 | HClO₃ | 0.01 | HCl | 0.01 | N/A | — | Sulfuric acid |
| Example 42 | NaClO | 1.0 | HClO₃ | 0.01 | HCl | 0.01 | N/A | — | Sulfuric acid |
| Example 43 | NaClO | 1.0 | HClO₃ | 0.01 | HCl | 0.01 | N/A | — | Sulfuric acid |
| Example 44 | NaClO | 1.0 | HClO₃ | 0.01 | HCl | 0.01 | N/A | — | Sulfuric acid |
| Example 45 | NaClO | 1.0 | HClO₃ | 0.01 | HCl | 0.01 | N/A | — | nitric acid |
| Example 46 | NaClO | 1.0 | HClO₃ | 0.01 | HCl | 0.01 | N/A | — | Hydrofluoric acid |
| Example 47 | NaClO | 1.0 | HClO₃ | 0.01 | HCl | 0.01 | N/A | 0.01 | TMAH |
| Example 48 | NaClO | 1.0 | HClO₃ | 0.01 | HCl | 0.01 | N/A | 1 | TMAH |
| Example 49 | NaClO | 1.0 | HClO₃ | 0.01 | HCl | 0.01 | N/A | 0.001 | TMAH |
| Example 50 | NaClO | 1.0 | HClO₃ | 0.01 | HCl | 0.01 | N/A | 0.01 | TEAH |

TABLE 2-continued

| | Ph of chemical solution | Hypochlorous acids/ specific anion | Hypochlorous acids/ specific cation | Dissolving ability | Smoothness |
|---|---|---|---|---|---|
| Example 26 | 12.0 | 1.0E+03 | — | B | C |
| Example 27 | 12.0 | 1.0E+04 | — | B | C |
| Example 28 | 12.0 | 2.0E+03 | — | B | C |
| Example 29 | 12.0 | 2.0E+06 | — | B | D |
| Example 30 | 6.0 | 5.0E−01 | — | D | A |
| Example 31 | 8.5 | 5.0E+00 | — | C | B |
| Example 32 | 12.0 | 5.0E+00 | — | B | B |
| Example 33 | 12.5 | 9.4E+00 | — | A | B |
| Example 34 | 13.0 | 1.5E+01 | — | A | C |
| Example 35 | 10.5 | 5.0E+01 | — | B | B |
| Example 36 | 12.0 | 5.0E+01 | — | B | B |
| Example 37 | 12.0 | 5.0E+02 | — | B | B |
| Example 38 | 12.0 | 5.0E+03 | — | B | B |
| Example 39 | 12.0 | 1.0E+03 | — | B | B |
| Example 40 | 12.0 | 1.0E+06 | — | B | C |
| Example 41 | 8.0 | 5.0E+01 | — | A | B |
| Example 42 | 7.0 | 5.0E+01 | — | B | B |
| Example 43 | 9.0 | 5.0E+01 | — | B | B |
| Example 44 | 10.0 | 5.0E+01 | — | B | B |
| Example 45 | 8.0 | 5.0E+01 | — | A | B |
| Example 46 | 8.0 | 5.0E+01 | — | A | B |
| Example 47 | 12.0 | 5.0E+01 | 1.0E+02 | B | A |
| Example 48 | 14.0 | 5.0E+01 | 1.0E+00 | B | A |
| Example 49 | 11.0 | 5.0E+01 | 1.0E+03 | B | B |
| Example 50 | 12.0 | 5.0E+01 | 1.0E+02 | B | A |

TABLE 3

| | Composition of chemical solution | | | | | | | | |
|---|---|---|---|---|---|---|---|---|---|
| | Hpochlorous acids | | Specific anion | | | | Specific cation | | |
| | | | $ClO_3^-$ | | $Cl^-$ | | | | |
| | Type | Content (% by mass) | Supply source | Content (% by mass) | Supply source | Content (% by mass) | Supply source | Content (% by mass) | pH adjuster |
| Example 51 | NaClO | 1.0 | $HClO_3$ | 0.01 | HCl | 0.01 | N/A | 0.01 | ETMAH |
| Example 52 | NaClO | 1.0 | $HClO_3$ | 0.01 | HCl | 0.01 | N/A | 0.01 | TBAH |
| Example 53 | KClO | 1.0 | $HClO_3$ | 0.01 | HCl | 0.01 | N/A | — | N/A |

TABLE 3-continued

| | | | | | | | | | |
|---|---|---|---|---|---|---|---|---|---|
| Example 54 | Ca(ClO)₂ | 1.0 | HClO₃ | 0.01 | HCl | 0.01 | N/A | — | N/A |
| Example 55 | HClO | 1.0 | HClO₃ | 0.01 | HCl | 0.01 | N/A | — | N/A |
| Example 56 | HClO | 1.0 | HClO₃ | 0.01 | HCl | 0.01 | N/A | 0.01 | TMAH |
| Example 57 | HClO | 1.0 | HClO₃ | 0.01 | HCl | 0.01 | N/A | 0.01 | TEAH |
| Example 58 | HClO | 1.0 | HClO₃ | 0.01 | HCl | 0.01 | N/A | 0.01 | ETMAH |
| Example 59 | HClO | 1.0 | HClO₃ | 0.01 | HCl | 0.01 | N/A | 0.01 | TBAH |
| Example 60 | HClO | 1.0 | HClO₃ | 0.01 | N(CH₃)₄Cl | 0.01 | N(CH₃)₄Cl | 0.021 | N/A |
| Example 61 | HClO | 1.0 | N/A | — | N(CH₃)₄Cl | 1 | N(CH₃)₄Cl | 2.091 | N/A |
| Example 62 | HClO | 1.0 | HClO₃ | 0.01 | N(C₂H₅)₄Cl | 0.01 | N(C₂H₅)₄Cl | 0.037 | N/A |
| Example 63 | HClO | 1.0 | HClO₃ | 0.01 | N(C₂H₅)(CH₃)₃Cl | 0.01 | N(C₂H₅)(CH₃)₃Cl | 0.025 | N/A |
| Example 64 | HClO | 1.0 | HClO₃ | 0.01 | N(C₃H₇)₄Cl | 0.01 | N(C₃H₇)₄Cl | 0.053 | N/A |
| Example 65 | HClO | 1.0 | HClO₃ | 0.01 | P(C₆H₅)₄Cl | 0.01 | P(C₆H₅)₄Cl | 0.096 | N/A |
| Comparative Example 1 | NaClO | 1.0 | N/A | — | N/A | — | N/A | — | N/A |
| Comparative Example 2 | NaClO | 1.0 | N/A | — | N/A | — | N/A | — | Sulfuric acid |
| Comparative Example 3 | NaClO | 1.0 | N/A | — | N/A | — | N/A | 0.01 | TMAH |
| Comparative Example 4 | N/A | — | HClO₃ | 0.1 | HCl | 0.1 | N/A | — | N/A |
| Comparative Example 5 | NaClO | 1.0 | HClO₃ | 2.0 | HCl | 2.0 | N/A | — | N/A |
| Comparative Example 6 | NaClO | 1.0 | HClO₃ | 2.0 | N/A | — | N/A | — | N/A |
| Comparative Example 7 | NaClO | 1.0 | N/A | — | HCl | 2.0 | N/A | — | N/A |

| | pH of chemical solution | Hypochlorous acids/ specific anion | Hypochlorous acids/ specific cation | Dissolving ability | Smoothness |
|---|---|---|---|---|---|
| Example 51 | 12.0 | 5.0E+01 | 1.0E+02 | B | A |
| Example 52 | 12.0 | 5.0E+01 | 1.0E+02 | B | A |
| Example 53 | 12.0 | 5.0E+01 | — | D | B |
| Example 54 | 12.0 | 5.0E+01 | — | D | B |
| Example 55 | 1.0 | 5.0E+01 | — | D | B |
| Example 56 | 8.0 | 5.0E+01 | 1.0E+02 | A | A |
| Example 57 | 8.0 | 5.0E+01 | 1.0E+02 | A | A |
| Example 58 | 8.0 | 5.0E+01 | 1.0E+02 | A | A |
| Example 59 | 8.0 | 5.0E+01 | 1.0E+02 | A | A |
| Example 60 | 1.0 | 5.0E+01 | 4.8E+01 | D | A |

TABLE 3-continued

|  |  |  |  |  |  |
|---|---|---|---|---|---|
| Example 61 | 1.0 | 1.0E+00 | 4.8E−01 | D | A |
| Example 62 | 1.0 | 5.0E+01 | 2.7E+01 | D | A |
| Example 63 | 1.0 | 5.0E+01 | 4.0E+01 | D | A |
| Example 64 | 1.0 | 5.0E+01 | 1.9E+01 | D | A |
| Example 65 | 1.0 | 5.0E+01 | 1.0E+01 | D | A |
| Comparative Example 1 | 12.0 | — | — | C | E |
| Comparative Example 2 | 8.0 | — | — | B | E |
| Comparative Example 3 | 12.0 | — | 1.0E+02 | B | E |
| Comparative Example 4 | 1.0 | — | — | E | D |
| Comparative Example 5 | 0.8 | 2.5E−01 | — | E | B |
| Comparative Example 6 | 1.0 | 5.0E−01 | — | E | B |
| Comparative Example 7 | 1.0 | 5.0E−01 | — | E | B |

From the results shown in the table, it has been confirmed that the chemical solution according to the embodiment of the present invention has excellent dissolving ability for a transition metal-containing substance and can realize excellent smoothness of a portion to be treated.

It has been confirmed that in view of further improving the dissolving ability of the chemical solution, the content (total content) of the hypochlorous acids with respect to the total mass of the chemical solution is preferably equal to or higher than 5.0% by mass, and more preferably equal to or higher than 15.0% by mass (comparison of Examples 2 to 5, comparison of Examples 14 to 17, and comparison of Examples 31 to 34).

It has been confirmed that in view of further improving the smoothness of the portion to be treated, the content of the hypochlorous acids with respect to the total mass of the chemical solution is preferably equal to or lower than 15.0% by mass (comparison between Examples 4 and 5, comparison between Examples 16 and 17, and comparison between Examples 33 and 34).

It has been confirmed that in a case where the chemical solution contains one kind of specific anion, in view of further improving the dissolving ability of the chemical solution, the content of one kind of the specific anion is preferably equal to or lower than 0.1% by mass with respect to the total mass of the chemical solution (comparison between Examples 1 and 2 and comparison between Examples 13 and 14). It has been confirmed that in a case where the chemical solution contains two kinds of specific anions, in view of further improving the dissolving ability of the chemical solution, the content of each of two kinds of the specific anions is preferably equal to or lower than 0.1% by mass with respect to the total mass of the chemical solution (comparison between Examples 30 and 31).

Particularly, it has been confirmed that in a case where the chemical solution contains one kind of specific anion, the content of one kind of the specific anion is more preferably equal to or lower than 0.01% by mass with respect to the total mass of the chemical solution (comparison between Examples 2 and 6 and comparison between Examples 14 and 18). Furthermore, it has been confirmed that in a case where the chemical solution two kinds of specific anions, the content of each of two kinds of the specific anions is more preferably equal to or lower than 0.01% by mass with respect to the total mass of the chemical solution (comparison between Examples 31 and 35).

It has been confirmed that in a case where the chemical solution contains one kind of specific anion, in view of further improving the smoothness of the portion to be treated, the content of one kind of the specific anion is preferably equal to or higher than 1 ppm by mass (comparison between Examples 10 and 12 and comparison between Examples 27 and 29). It has been confirmed that in a case where the chemical solution contains two kinds of specific anions, in view of further improving the smoothness of the portion to be treated, the content of each of two kinds of the specific anions is preferably equal to or higher than 1 ppm by mass (comparison between Examples 38 and 40).

It has been confirmed that from the viewpoint of further improving the smoothness of the portion to be treated, it is preferable that the chemical solution contains both of $ClO_3^-$ and $Cl^-$, and each of the content of $ClO_3^-$ and the content of $Cl^-$ is 5 ppb by mass to 1% by mass with respect to the total mass of the chemical solution (comparison of Examples 39, 9, and 26, and the like).

It has been confirmed that in view of further improving the dissolving ability of the chemical solution, the ratio (mass ratio) of the content (total content) of the hypochlorous acids to the content (total content) of the specific anion is preferably equal to or higher than $5\times10^0$ and more preferably equal to or higher than $5\times10^1$ (comparison of Examples 1, 2, 6, 13, 14, 18, 30, 31, and 35).

It has been confirmed that in view of further improving the smoothness of the portion to be treated, the ratio (mass ratio) of the content (total content) of the hypochlorous acids to the content (total content) of the specific anion is preferably lower than $2\times10^6$ (comparison between Examples 10 and 12, and comparison between Examples 27 and 29).

It has been confirmed that in view of further improving the smoothness of the portion to be treated, it is preferable that the chemical solution contains the specific cation (comparison of Examples 18 to 20 and Examples 21 to 25 and 47 to 52, and comparison of Examples 53 to 55 and Examples 56 to 65).

It has been confirmed that in view of further improving the smoothness of the portion to be treated, the content (total content) of the specific cation is preferably equal to or higher than 0.005% by mass with respect to the total mass of the chemical solution (comparison between Examples 47 and 49).

It has been confirmed that in view of further improving the smoothness of the portion to be treated, the ratio (mass ratio) of the content (total content) of the hypochlorous acids to the content (total content) of the specific cation is preferably equal to or lower than $2.0\times10^2$ (comparison between Examples 47 and 49).

It has confirmed that in view of further improving the dissolving ability of the chemical solution, it is preferable that the hypochlorous acids contain sodium hypochlorite (comparison of Examples 35 and 53 to 55).

It has been confirmed that in view of further improving the dissolving ability of the chemical solution, it is preferable that the pH of the chemical solution is higher than 7.0 and lower than 9.0 (comparison of Examples 35 and 41 to 46).

EXPLANATION OF REFERENCES

10a: wiring substrate not yet being subjected to recess etching treatment for wiring
10b: wiring substrate having undergone recess etching treatment for wiring
12: interlayer insulating film
14: barrier metal layer
16: transition metal-containing wiring
18: recess
20, 30: object to be treated
22: substrate
24: transition metal-containing film
26: outer edge
32: substrate
34: transition metal-containing film
36: etch stop layer
38: interlayer insulating film
40: metal hard mask
42: hole
44: inner wall
44a: cross-sectional wall
44b: bottom wall
46: dry etching residue

What is claimed is:

1. A chemical solution used for removing a transition metal-containing substance on a substrate, comprising:
    one or more kinds of hypochlorous acids selected from the group consisting of hypochlorous acid and a salt thereof;
    one or more kinds of specific anions selected from the group consisting of $ClO_3^-$ and $Cl^-$, and
    one or more kinds of specific cations selected from the group consisting of a quaternary ammonium cation and a quaternary phosphonium cation,
    wherein the content of the hypochlorous acids is equal to or higher than 0.5% by mass with respect to the total mass of the chemical solution,
    the solution comprises at least $ClO_3^-$ among the specific anions,
    in a case where the chemical solution contains one kind of the specific anion, the content of one kind of the specific anion is 5 ppb by mass to 1% by mass with respect to the total mass of the chemical solution, and
    in a case where the chemical solution contains two kinds of the specific anions, the content of each of two kinds of the specific anions is equal to or lower than 1% by mass with respect to the total mass of the chemical solution, and the content of at least one of two kinds of the specific anions is equal to or higher than 5 ppb by mass with respect to the total mass of the chemical solution.

2. The chemical solution according to claim 1, comprising:
    both of $ClO_3^-$ and $Cl^-$,
    wherein each of the content of $ClO_3^-$ and the content of $Cl^-$ is 5 ppb by mass to 1% by mass with respect to the total mass of the chemical solution.

3. The chemical solution according to claim 1, wherein the content of the hypochlorous acids is 0.5% to 30% by mass with respect to the total mass of the chemical solution.

4. The chemical solution according to claim 1, wherein the content of the hypochlorous acids is 0.5% to 20.0% by mass with respect to the total mass of the chemical solution.

5. The chemical solution according to claim 1, wherein in a case where the chemical solution contains one kind of the specific anion, the ratio of the content of the hypochlorous acids to the content of one kind of the specific anion is $5\times10^{-1}$ to $1\times10^7$, and
    in a case where the chemical solution contains two kinds of the specific anion, the ratio of the content of the hypochlorous acids to the total content of two kinds of the specific anion is $5\times10^{-1}$ to $1\times10^7$.

6. The chemical solution according to claim 1, wherein in a case where the chemical solution contains one kind of the specific anion, the content of one kind of the specific anion is 1 ppm by mass to 0.1% by mass with respect to the total mass of the chemical solution, and
    in a case where the chemical solution contains two kinds of the specific anions, the content of each of two kinds of the specific anions is 1 ppm by mass to 0.1% by mass with respect to the total mass of the chemical solution.

7. The chemical solution according to claim 1, wherein the hypochlorous acids contain sodium hypochlorite.

8. The chemical solution according to claim 1,
wherein the transition metal-containing substance contains at least one kind of metal selected from the group consisting of Ru, Rh, Ti, Ta, Co, Cr, Hf, Os, Pt, Ni, Mn, Cu, Zr, Mo, La, W, and Ir.

9. The chemical solution according to claim 1,
wherein the transition metal-containing substance contains a Ru-containing substance.

10. The chemical solution according to claim 1 that has a pH equal to or lower than 10.0.

11. The chemical solution according to claim 1 that has a pH higher than 7.0 and lower than 9.0.

12. A method for treating a substrate, comprising:
a step A of removing a transition metal-containing substance on a substrate by using the chemical solution according to claim 1.

13. The method for treating a substrate according to claim 12,
wherein the transition metal-containing substance contains a Ru-containing substance.

14. The method for treating a substrate according to claim 12,
wherein the step A is a step A1 of performing a recess etching treatment on transition metal-containing wiring disposed on a substrate by using the chemical solution, a step A2 of removing a transition metal-containing film at an outer edge of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, or a step A5 of removing a transition metal-containing substance on a substrate, which has undergone a chemical mechanical polishing treatment, by using the chemical solution.

15. The method for treating a substrate according to claim 14 that has the step A1 as the step A, further comprising:
a step B of treating, before or after the step A1, the substrate obtained by the step A1 by using a solution selected from the group consisting of a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide.

16. The method for treating a substrate according to claim 15,
wherein the step A1 and the step B are alternately repeated.

17. The method for treating a substrate according to claim 12, further comprising:
a step C of performing a rinsing treatment on the substrate obtained by the step A by using a rinsing solution after the step A.

18. The method for treating a substrate according to claim 17,
wherein the rinsing solution is a solution selected from the group consisting of hydrofluoric acid, hydrochloric acid, aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, and an aqueous orthoperiodic acid solution.

19. The method for treating a substrate according to claim 12,
wherein a temperature of the chemical solution is 20° C. to 75° C.

20. A chemical solution used for removing a transition metal-containing substance on a substrate, comprising:
one or more kinds of hypochlorous acids selected from the group consisting of hypochlorous acid and a salt thereof;
one or more kinds of specific anions selected from the group consisting of $ClO_3^-$ and $Cl^-$, and
one or more kinds of specific cations selected from the group consisting of a quaternary ammonium cation and a quaternary phosphonium cation,
wherein in a case where the chemical solution contains one kind of the specific anion, the content of one kind of the specific anion is 5 ppb by mass to 1% by mass with respect to the total mass of the chemical solution,
in a case where the chemical solution contains two kinds of the specific anions, the content of each of two kinds of the specific anions is equal to or lower than 1% by mass with respect to the total mass of the chemical solution, and the content of at least one of two kinds of the specific anions is equal to or higher than 5 ppb by mass with respect to the total mass of the chemical solution,
in a case where the chemical solution contains one kind of the specific anion, the ratio of the content of the hypochlorous acids to the content of one kind of the specific anion is equal to or higher than 5, and
in a case where the chemical solution contains two kinds of the specific anion, the ratio of the content of the hypochlorous acids to the total content of two kinds of the specific anion is equal to or higher than 5.

21. A chemical solution used for removing a transition metal-containing substance on a substrate, comprising:
one or more kinds of hypochlorous acids selected from the group consisting of hypochlorous acid and a salt thereof;
one or more kinds of specific anions selected from the group consisting of $ClO_3^-$ and $Cl^-$, and
one or more kinds of specific cations selected from the group consisting of a quaternary ammonium cation and a quaternary phosphonium cation,
wherein in a case where the chemical solution contains one kind of the specific anion, the content of one kind of the specific anion is 5 ppb by mass to 1% by mass with respect to the total mass of the chemical solution,
in a case where the chemical solution contains two kinds of the specific anions, the content of each of two kinds of the specific anions is equal to or lower than 1% by mass with respect to the total mass of the chemical solution, and the content of at least one of two kinds of the specific anions is equal to or higher than 5 ppb by mass with respect to the total mass of the chemical solution,
the content of the hypochlorous acids is equal to or higher than 0.5% by mass with respect to the total mass of the chemical solution, and the chemical solution has a pH equal to or lower than 10.0.

* * * * *